United States Patent [19]
Piquet

[11] Patent Number: 5,822,051
[45] Date of Patent: Oct. 13, 1998

[54] LINE AMPLIFIER FOR STATIC RAM MEMORY

[75] Inventor: Philippe Franck Piquet, Montigny-le-Bretonneux, France

[73] Assignee: Matra MHS, France

[21] Appl. No.: 665,631

[22] Filed: Jun. 18, 1996

[30] Foreign Application Priority Data

Jun. 19, 1995 [FR] France ................................ 95 07298

[51] Int. Cl.$^6$ ................................ G11C 7/00; G11C 7/02
[52] U.S. Cl. ........................ 365/205; 365/207; 365/203; 327/51; 327/52
[58] Field of Search .................................. 365/205, 207, 365/154, 203; 327/51, 52

[56] References Cited

U.S. PATENT DOCUMENTS 5,504,443  4/1996  Gross et al. ............................ 327/51
5,521,874  5/1996  Sandhu .................................. 356/207

FOREIGN PATENT DOCUMENTS 434090  6/1991  European Pat. Off. .
626693  11/1994  European Pat. Off. .

*Primary Examiner*—David C. Nelms
*Assistant Examiner*—Huan Hoang
*Attorney, Agent, or Firm*—Larson & Taylor

[57] ABSTRACT

A line amplifier for static RAM memory in CMOS technology comprises first and second branches formed by a first plurality of transistors ($TP_1$, $TN_1$, $TN_2$) and a second plurality of transistors ($TP_2$, $TN_3$, $TN_2$), respectively. The branches are connected in series between the power supply (Vdd) and reference voltage (Vss). A positive feedback is produced by direct connection through internal nodes, and an evaluation switching transistor makes it possible to equalize the values of the voltages on the internal nodes at equilibrium. Under read control (CL), the transistor ($TN_2$) makes it possible to amplify the preliminary difference between voltage levels due to a transition of the bit signal (D) and complemented bit signal ($\bar{D}$) applied to the internal nodes. A precharge transistor ($TN_4$) is common to the first and second branches and thus allows an increase in switching speed.

6 Claims, 3 Drawing Sheets

LINE AMPLIFIER FOR STATIC RAM MEMORY

The invention relates to a line amplifier for static RAM memory, random-access memory.

By reason of the rapid evolution of the technologies for integrating integrated circuits which are currently employed, static RAM memories exhibit on ever greater integration density. Consequently, all the parts or areas of these memories have to be optimized so as to allow the fastest possible access to the stored data.

Figure 1A:
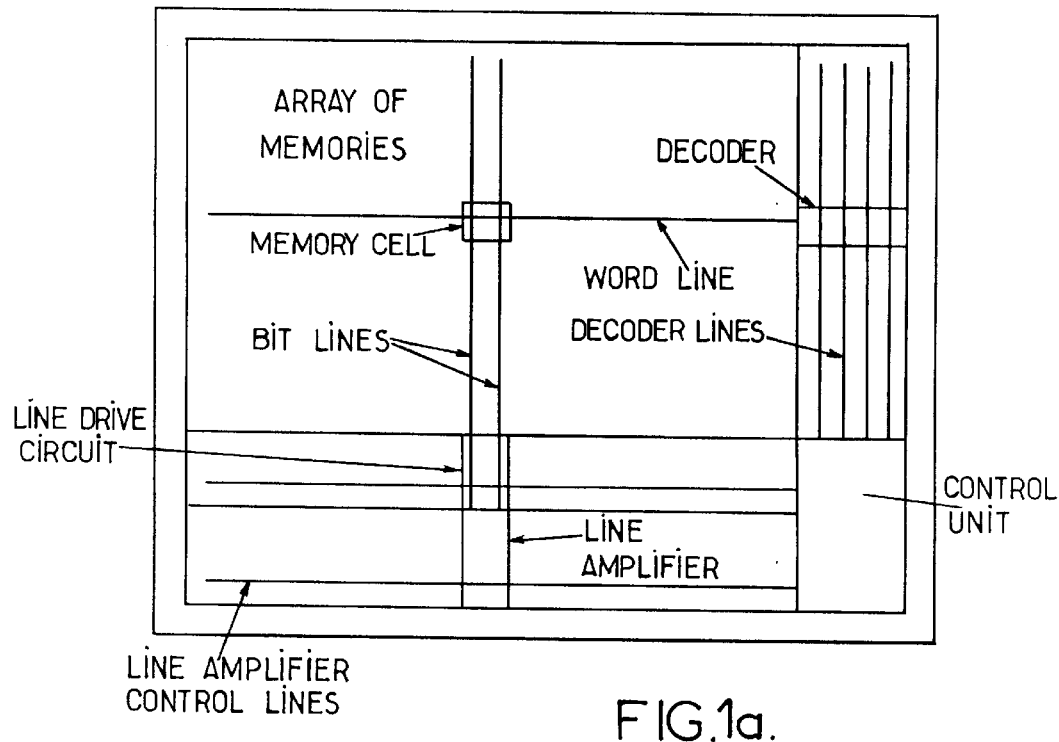

As represented diagrammatically in FIG. 1a, a memory of this type consists of a set of analog and digital modules, that is to say bit memory-storage cells, bit line drive circuits, line amplifiers and decoders. Usually, conventional-type gates are used to make the decoders faster, the most intricate part consisting of the line amplifiers. The line drive circuits make it possible to feed the array of memory cells in digital form.

More specifically, as represented in the above-mentioned FIG. 1a, as far as the organization of such memories is concerned, it will be recalled that such a memory in fact consists of a large array containing a certain number of memory cells (sometimes more than one million), forming an array of memories and of auxiliary cells reproduced many times. The main cells determining the dimensioning and the layout of a memory are the memory cells, the decoders, the line drive circuits, the line amplifiers and the control unit. Some cells comprise a few transistors, others are macro cells which have to be divided into elementary cells.

Most often, it is appropriate to place each line amplifier close to the external access so as to insert small buffer circuits therein and thus to reduce the load of the device.

Figure 1B:
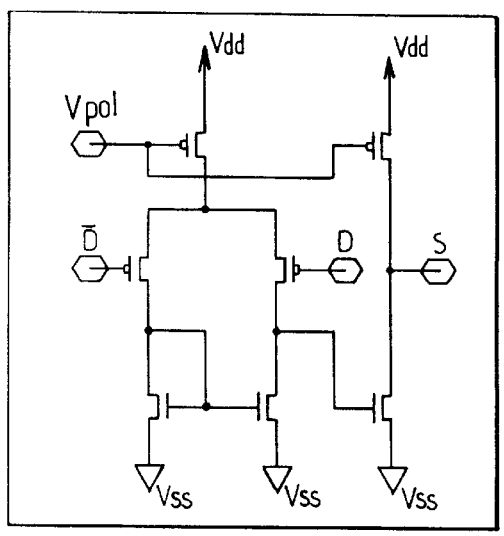
Figure 1C:
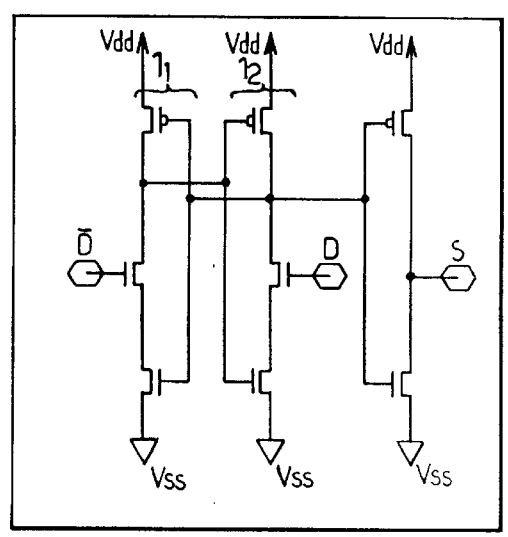

As far as the line amplifiers are concerned, two different types are currently used: the current-mirror line amplifier and the positive-feedback amplifier, as represented in FIG. 1b and 1c respectively.

Each of the abovementioned two types of amplifier exhibits advantages and drawbacks.

The current-mirror line amplifier is very stable but slow, two or three stages having to be connected in cascade so as to obtain high gain. In the event that small stray voltage pulses appear on the inputs, the output always recovers its initial state, after a certain time.

The positive-feedback line amplifier comprises a first and a second branch $1_1$, $1_2$ between which the positive feedback is applied, and an output stage. It exhibits high gain, but, consequently, is not sufficiently stable. Consequently, a single stage is sufficient. When the voltage difference between the inputs D, $\overline{D}$ is sufficiently large, the output switches over. If the bistable latch, formed by the positive feedback, switches to its complemented state inadvertently, by reason of noise for example, the initial original state is never recovered in a sufficiently short time.

Finally, it should be remembered that current-mirror and positive-feedback line amplifiers are often controlled by control signals in order to reduce energy dissipation or the noise level.

The object of the present invention is to remedy the abovementioned drawbacks, by implementing a line amplifier for static RAM memory, of the positive-feedback type, nevertheless exhibiting a very short switching time.

A further subject of the present invention is the implementation of a line amplifier for static RAM memory, of the positive-feedback type, in which the static electrical consumption is reduced.

A further subject of the present invention is the implementation of a line amplifier for static RAM memory, of the positive-feedback type, in which the dynamic electrical consumption, during switches, is also reduced by reason of switchings carried out in two phases.

A further subject of the present invention is the implementation of a line amplifier for static RAM memory, of the positive-feedback type, in which the detection of the data set up is facilitated by virtue of the implementation of the corresponding logic signals and of their logic complement.

A further subject of the present invention is the implementation of a line amplifier for static RAM memory, of the positive-feedback type, in which latching of the output signal can easily be carried out.

The line amplifier for a static RAM memory, the subject of the present invention, comprises a differential stage with positive feedback between a first and second branch which are connected between a power supply voltage and a reference voltage, each branch receiving at least one bit signal and the complemented bit signal respectively and an output stage delivering a bit read signal.

It is noteworthy in that the first branch includes at least a first PMOS transistor and a second NMOS transistor which are connected in series between the power supply voltage and the reference voltage. The gate electrode of the first PMOS transistor receives the bit signal and is linked to the gate electrode of the first NMOS transistor via a diode making it possible to limit the low value of the voltage applied to the gate electrode of the first PMOS transistor to a defined positive value, the gate electrode of the second NMOS transistor receiving a read control signal.

The second branch includes at least a second PMOS transistor and a third NMOS transistor which are connected in series between the power supply voltage and the drain-source common point of the first and of the second NMOS transistor of the first branch. The gate electrode of the second PMOS transistor receives the complemented bit signal and is linked to the gate electrode of the third transistor via a diode making it possible to limit the low value of the voltage applied to the gate electrode of the second PMOS transistor to the defined positive threshold value.

The second NMOS transistor is common to the first and to the second branch and makes it possible to amplify the preliminary difference between the voltage levels generated by a transition of the bit signal and of the complemented bit signal.

The first and the second branch further include a precharge NMOS transistor connected between the power supply voltage and the drain-source common point between the first, the second and the third NMOS transistor of the first and of the second branch, the gate electrode of the precharge transistor receiving a precharge control signal.

The positive feedback is formed by a first direct link between the drain-source common point of the first PMOS transistor and of the first NMOS transistor of the first branch and the gate electrode of the third NMOS transistor of the second branch, by a second direct link between the drain-source common point of the second PMOS transistor and of the third NMOS transistor of the second branch and the gate electrode of the first NMOS transistor of the first branch and by a PMOS-type switching transistor linking the first and the second direct link, and the gate electrode of which is driven by the complemented precharge signal.

The line amplifier for static RAM memory, the subject of the present invention, finds an application to the production of static RAM memories in integrated circuit form in CMOS technology.

Figure 2A:
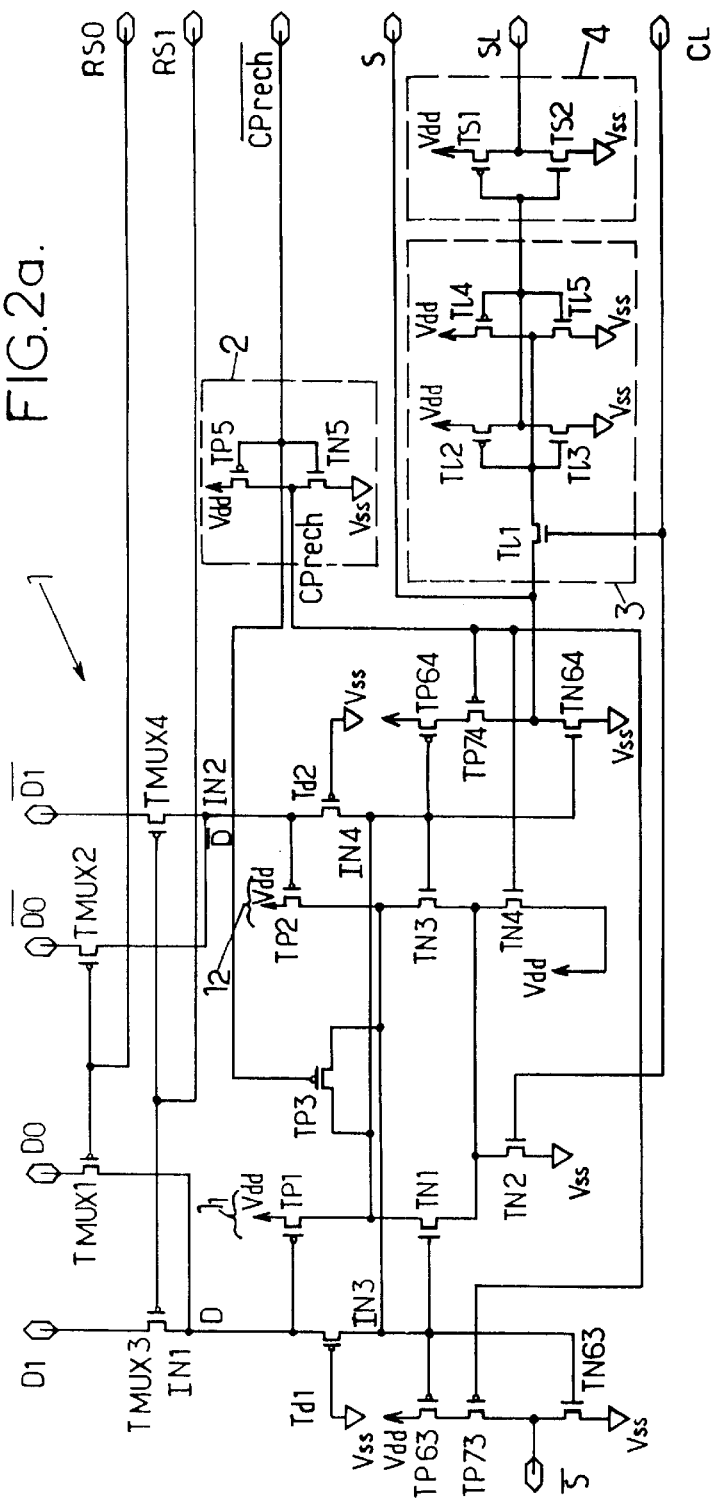
Figure 2B:
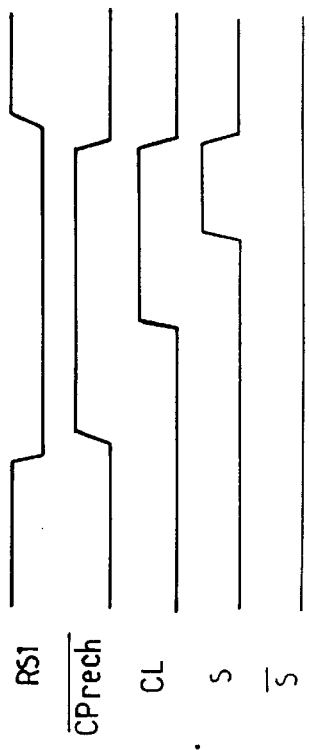
Figure 3A:
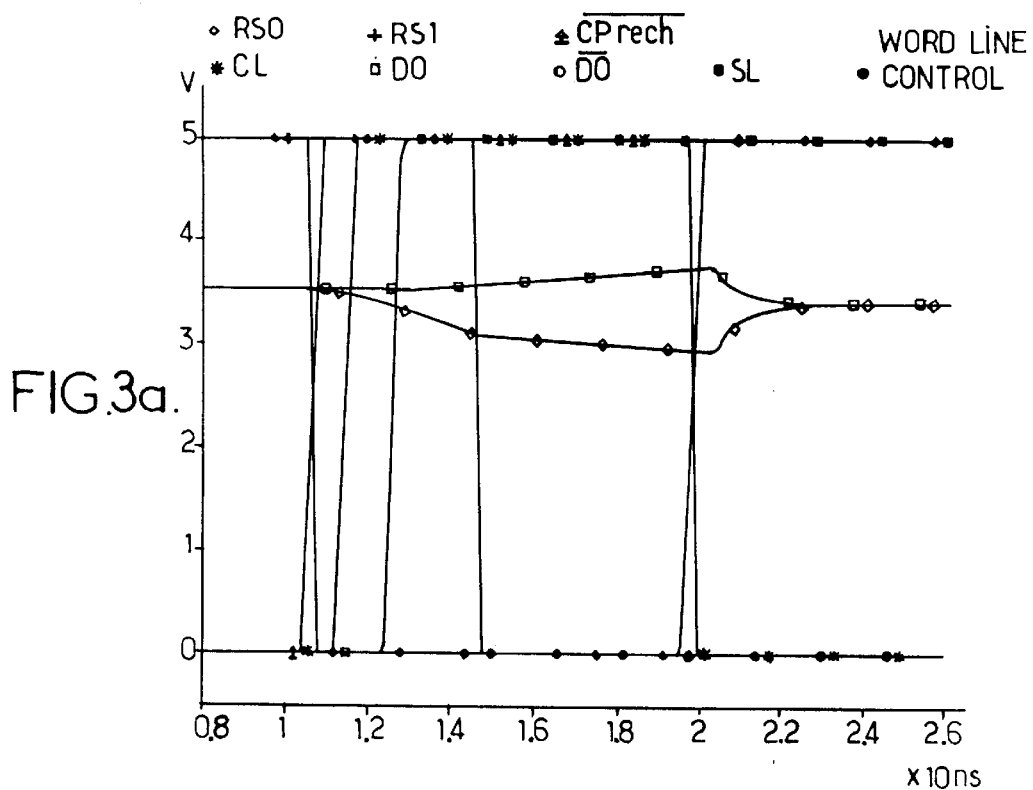
Figure 3B:
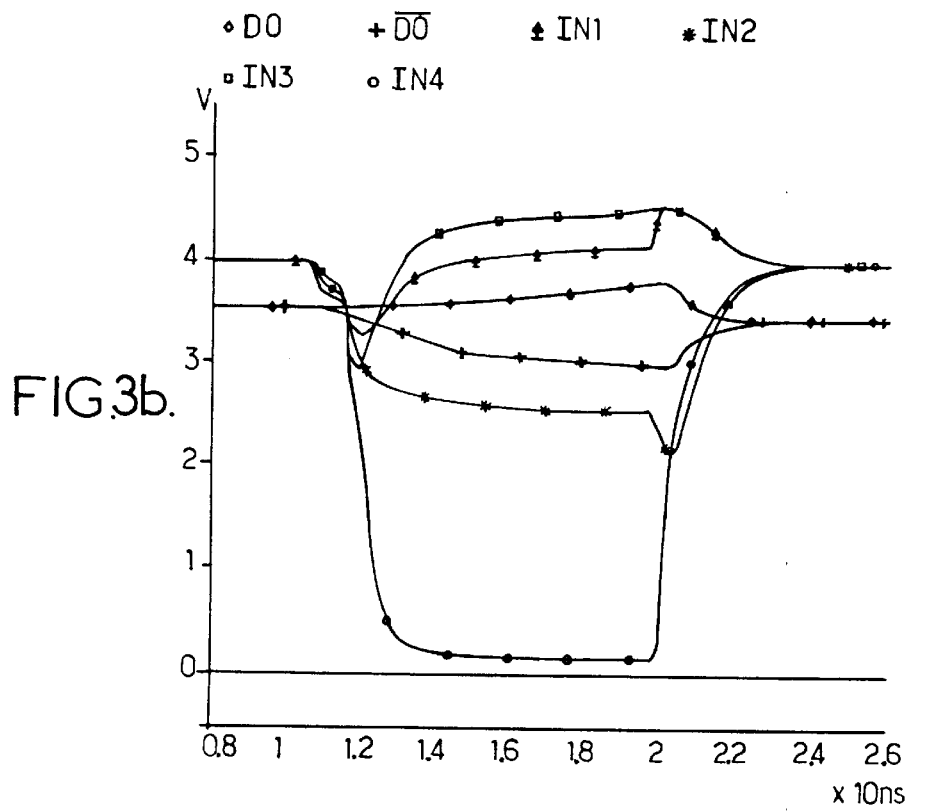

It will be better understood on reading the description and on perusing the drawings hereinafter in which, apart from FIG. 1a, 1b and 1c relating to known devices of the prior art:

FIG. 2a represents an illustrative diagram of the structure of the line amplifier for static RAM memory, the subject of the present invention;

FIG. 2b qualitatively represents a timing diagram of the main signals revealed at various test points of FIG. 2a;

FIGS. 3a and 3b represent a timing diagram of signals at significant test points of FIG. 2a.

A more detailed description of a line amplifier for static RAM memory, the subject of the present invention, will now be given in connection with FIGS. 2a and 2b.

As can be seen on perusing the abovementioned FIG. 2a, it is shown that the line amplifier for static RAM memory, according to the invention, comprises a differential stage 1 with positive feedback between a first and a second branch, the first and the second branch bearing the references $1_1$ and $1_2$ respectively in the abovementioned figure. The first and the second branch are connected between a power supply voltage, denoted Vdd, and a reference voltage Vss, this reference voltage consisting of the earth voltage of the amplifier.

In general, it is shown that each branch, first and second branch $1_1$, $1_2$, receives at least one bit signal, denoted D, and the complemented bit signal, denoted $\overline{D}$, the bit signal and the complemented bit signal normally being delivered by a defined memory cell of the memory array under conventional control by means of word lines and bit lines as represented in FIG. 1a.

More specifically, as is apparent in FIG. 2a, it is shown that, advantageously, the bit signal D and the complemented bit signal $\overline{D}$ respectively may consist of one from among a plurality of bit signals or complemented bit signals respectively, denoted on the same FIG. 2a $D_1$, $D_0$, and $\overline{D}_0$, $\overline{D}_1$ respectively, the number of bit signals capable of being applied to the first $1_1$ or the second $1_2$ branch respectively obviously not being limited to two.

According to one particular aspect of the line amplifier for static RAM memory, the subject of the present invention, as represented in FIG. 2a, it is shown that the bit signal D and the complemented signal $\overline{D}$ are then applied to the first branch $1_1$ and to the second branch $1_2$ respectively, from all the bit signals $D_1$, $D_0$ or complemented bit signals $\overline{D}_0$, $\overline{D}_1$ respectively by means of multiplexing transistors denoted $T_{mux1}$, $T_{mux2}$ and $T_{mux3}$, $T_{mux4}$. It is shown that the abovementioned multiplexing transistors are connected in switching mode so as to transmit one or other of the abovementioned bit signals on an internal node, denoted $IN_1$ for the first branch and $IN_2$ for the second branch respectively. Control of the abovementioned multiplexing transistors is achieved by means of control signals applied to the gate electrode of the multiplexing transistors $T_{mux1}$, $T_{mux2}$ for the $D_0$ bit and $\overline{D}_0$ complemented bit signals, this control signal being denoted $RS_0$, and by a corresponding complemented signal $RS_1$ applied to the gate electrode of the multiplexing transistors $T_{mux3}$, $T_{mux4}$ for the bit $D_1$ and complemented bit $\overline{D}_1$ signals. By applying control signals $RS_0$ and $RS_1$, the bit signal D and the complemented bit signal $\overline{D}$ applied to the internal nodes $IN_1$ and $IN_2$ respectively is [sic] thus the bit signal $D_0$ or $D_1$ respectively and the complemented bit signal, $\overline{D}_0$ and $\overline{D}_1$ respectively.

Moreover, conventionally, the line amplifier for static RAM memory, the subject of the invention, as represented in the abovementioned FIG. 2a, comprises an output stage, bearing the reference 4, which delivers a bit read signal, denoted SL, as will be described later in the description.

According to one particularly advantageous aspect of the line amplifier which is the subject of the present invention, it is shown that the first branch $1_1$ includes at least a first PMOS transistor, denoted $TP_1$, a first NMOS transistor, denoted $TN_1$, and a second NMOS transistor, denoted $TN_2$, which are connected in series between the power supply voltage Vdd and the reference voltage Vss. The gate electrode of the first PMOS transistor $TP_1$ receives the bit signal D delivered by multiplexing in the conditions mentioned previously in the description. The abovementioned gate electrode is linked to the gate electrode of the first NMOS transistor $TN_1$ via a diode bearing the reference $Td_1$. This diode makes it possible to limit the low value of the voltage applied to the gate electrode of the first PMOS transistor $TP_1$ upon switching of the bit signal D, this applied voltage being limited in this way to a defined positive value, which is related to the threshold voltage of the abovementioned diode $Td_1$. The gate electrode of the second NMOS transistor $TN_2$ receives a read control signal, denoted CL, which is delivered by the control unit in a conventional way.

Moreover, as has also been represented in FIG. 2a, the second branch $1_2$ includes at least a second PMOS transistor, denoted $TP_2$, and a third NMOS transistor, denoted $TN_3$, which are connected in series between the power supply voltage Vdd and the drain-source common point of the first and of the second NMOS transistor, $TN_1$, $TN_2$ of the first branch $1_1$.

In the representation of the line amplifier for static RAM memory, the subject of the present invention, of FIG. 2a, it is shown that the point represented in the region of one of the electrodes of the PMOS and NMOS transistors respectively designates the drain or source electrode of this transistor taken to the highest potential as far as the PMOS transistors are concerned, and to the lowest potential as far as the NMOS transistors are concerned.

Moreover, the gate electrode of the second PMOS transistor $TP_2$ receives the complemented bit signal $\overline{D}$, this electrode being linked to the gate electrode of the third NMOS transistor $TN_3$ in a way which is symmetric with the gate electrode of the first PMOS transistor $TP_1$ of the first branch $1_1$, via a diode bearing the reference $Td_2$. The diode $Td_2$ makes it possible, in a similar way, to limit the low value of the voltage applied to the gate electrode of the second PMOS transistor $TP_2$ to the defined positive threshold value previously mentioned in connection with the diode bearing the reference $Td_1$.

Clearly, in a specific embodiment, the diodes $Td_1$ and $Td_2$ can be embodied as matched components so that the threshold values introduced are substantially equal.

According to another particularly advantageous aspect of the line amplifier for static RAM memory, the subject of the present invention, it will be noticed that the second NMOS transistor $TN_2$ is common to the first and to the second branch $1_1$, $1_2$. This second NMOS transistor $TN_2$ makes it possible to amplify the preliminary difference between the voltage levels generated by a transition of the bit signal D and of the complemented bit signal $\overline{D}$.

Finally, the first and second branches $1_1$ and $1_2$ further include a precharge NMOS transistor in common, denoted $TN_4$. This transistor is connected between the power supply voltage Vdd and the drain-source common point between the first, the second and the third NMOS transistor $TN_1$, $TN_2$, $TN_3$ of the first and of the second branch, $1_1$, $1_2$. The gate electrode of the precharge transistor $TN_4$ receives a precharge control signal, denoted CPrech, which is also generated from the control unit.

Finally, the positive feedback between the first and the second branch $1_1$ and $1_2$, as represented in FIG. 2a, is advantageously formed by a first direct link between the drain-source common point of the first PMOS transistor $TP_1$ and of the first NMOS transistor $TN_1$ of the first branch and the gate electrode of the third NMOS transistor $TN_3$ of the second branch $1_2$. A second direct link between the drain-source common point of the second PMOS transistor $TP_2$ and of the third NMOS transistor $TN_3$ of the second branch and the gate electrode of the first NMOS transistor $TN_1$ of the first branch is furthermore provided in order to produce the abovementioned positive feedback.

Finally, and according to a particular advantageous aspect of the line amplifier for static RAM memory according to the invention, a PMOS-type switching transistor, bearing the reference $TP_3$, is provided, this switching transistor linking the first and the second abovementioned direct link. The gate electrode of the switching transistor $TP_3$ is controlled by the complemented precharge control signal, denoted $\overline{CPrech}$.

In general, it is shown that the complemented precharge signal denoted $\overline{CPrech}$ is delivered by the control unit, as represented in FIG. 1a, and that, advantageously, the amplifier according to the invention as represented in FIG. 2a can be equipped with an invertor, bearing the reference 2, receiving the abovementioned complemented precharge control signal $\overline{CPrech}$ and delivering the precharge control signal proper, CPrech. In a conventional way, it is shown that the invertor 2 may consist of a PMOS transistor $TP_5$ and a NMOS transistor $TN_5$ which are connected in series between the power supply voltage Vdd and the reference voltage Vss. The common gate electrode of the abovementioned transistors receives the complemented precharge control signal and the drain-source common point of the transistors $TP_5$ and $TN_5$ delivers the precharge control signal proper, CPrech.

The operating mode of the line amplifier, the subject of the present invention, as represented in FIG. 2a, will be described in connection with FIG. 2b, which represents the main signals employed, control signal $RS_1$, complemented precharge control signal $\overline{CPrech}$, read control signal CL, and, finally, output signal S and its complement $\overline{S}$, this output signal S being synchronous with the bit read signal SL but corresponding more specifically to the output signal delivered at an internal node $IN_4$ consisting of the first direct link mentioned previously in the description.

As far as the operating mode of the line amplifier as represented in FIG. 2a is concerned, it is shown, in a general way, that the positive feedback is achieved by the first and the second direct link between the PMOS and NMOS transistors $TP_1$, $TN_1$, of the first branch $1_1$ and the PMOS and NMOS transistors $TP_2$, $TN_3$ of the second branch $1_2$.

The multiplexing transistors $T_{mux1}$ to $T_{mux4}$ in fact constitute a two-channel-from-four analog multiplexer making it possible to apply the bit signal and the complemented bit signal D, $\overline{D}$ on the internal nodes $IN_1$ and $IN_2$, i.e., finally, onto the gate electrode of the PMOS transistor $TP_1$ of the first branch and of the PMOS transistor $TP_2$ of the second branch. The switching transistor $TP_3$, between the first and the second direct link, that is to say between the third $IN_3$ and the fourth $IN_4$ internal node, makes it possible, upon switching, to equalize the value of the voltage applied to the abovementioned internal nodes $IN_1$, $IN_2$ and $IN_3$, and $IN_4$, that is to say, in fact, on the bistable-type latch performed by the first branch $1_1$ and the second branch $1_2$ which are equipped with the abovementioned direct links constituting the positive feedback. The NMOS transistor $TN_2$ is used during a phase known as evaluation phase, during which the NMOS transistor $TN_2$, common to the first and to the second branch $1_1$ and $1_2$ makes it possible to amplify the preliminary difference between the voltage levels generated by a transition of the bit signal D and of the complemented bit signal $\overline{D}$, this evaluation phase being controlled, obviously, by the passage to the high level by the read control signal CL as represented in FIG. 2b, while the NMOS transistor $TN_4$, precharge transistor, is used during a precharge phase, which is controlled by the passage to the low level of the complemented precharge control signal $\overline{CPrech}$, and by the precharge control signal proper, CPrech, respectively. It is thus understood that, by reference to FIG. 2b, the bit signal $D_1$ and the complemented bit signal $\overline{D}_1$, for example, being applied to the internal nodes $IN_1$ and $IN_2$ respectively to constitute the bit signal D and complemented bit signal $\overline{D}$ respectively, the passage to the low level by the complemented precharge signal $\overline{CPrech}$ makes it possible to carry out precharging of the first and of the second branch $1_1$ and $1_2$, then, with precharging thus being carried out, the passage to the high level by the read control signal Cl and by the complemented precharge signal $\overline{CPrech}$ then makes it possible in fact to carry out reading proper or evaluation so as then to deliver the output signal S representative of the value of the bit signal D.

It is shown that all the other transistors used and represented in FIG. 2a are supplementary constituent elements making it possible to ensure either better shaping of the signal delivered by the line amplifier which is the subject of the present invention, or to allow effective separation of the line amplifier, the subject of the present invention, as represented in FIG. 2a, from the external circuits.

It is shown that the signals represented in FIG. 2b correspond to the non-limiting case in which the analog signal of the bit signal D is greater than the analog signal of the complemented bit signal $\overline{D}$.

In a general way, it is reiterated that when the multiplexing control signals $RS_0$ and $RS_1$ are at the high logic level and when the complemented precharge control signal $\overline{CPrech}$ is at the low logic level, whereas the read control signal CL is at the low logic level, the line amplifier, the subject of the present invention, as represented in FIG. 2a, is in a stable state as it is then completely disconnected from the bit and complemented bit signals $D_0$, $D_1$ and $\overline{D}_0$, $\overline{D}_1$. In such a situation, the precharge $TN_4$ and switching $TP_3$ transistors allowing equalization of the voltages between the internal nodes $IN_1$, $In_2$ [sic] and $IN_3$, $IN_4$ maintain the internal nodes of the abovementioned line amplifier at a voltage value $V_0$, which satisfies the relation:

$$V_0 = Vdd - Ven - Vben + Veq.$$

In the abovementioned relationship it is shown that Vdd, clearly, designates the power supply voltage, Ven is the threshold voltage of the N-channel-type transistor for a zero source-substrate voltage, Vben is the substrate-effect voltage associated with the same transistor, Veq designating the voltages introduced by the first PMOS transistor $TP_1$ of the first branch and by the second PMOS transistor $TP_2$ of the second branch by reason of the fact that these transistors are in the conducting state and thus introduce a corresponding voltage drop. Simultaneously, the global bit lines, that is to say those transmitting the values of the bit signals $D_0$, $D_1$ and complemented bit signals $\overline{D}_0$, $\overline{D}_1$ are also precharged to a voltage value $V_0 + Veq$, N-channel MOS transistor devices possibly being used to reduce the switching amplitude on the abovementioned bit lines.

When, in contrast, a read operation is carried out, one of the read signals, $RS_0$ or $RS_1$ for example, as represented in FIG. 2b, is taken to the low logic level. In consequence, the corresponding data lines start to unload by reason of the fact that the transistors for access to the corresponding memory cells are conducting; the multiplexing transistors have been set to the conducting state by the signal $RS_1$ or $RS_0$. The complemented precharge control signal $\overline{CPrech}$ is then taken to its high level, as represented in FIG. 2b, and the bistable latch consisting of the first and the second branch $1_1$ and $1_2$ and of the previously mentioned direct links, and thus of the PMOS and NMOS transistors $TP_1$ and $TN_1$ of the first branch, and PMOS and NMOS transistors $TP_2$ and $TN_2$ respectively of the second branch, loses its equilibrium state, the potentials on the internal nodes $IN_1$ and $IN_2$ then being unbalanced. When the voltage difference between the abovementioned internal nodes reaches a few tens of millivolts, of the order of 50 millivolts, the read control signal CL reaches the high logic level and makes it possible to maintain the abovementioned bistable latch in its corresponding stable state. The first NMOS transistor $TN_1$ of the first branch or the third NMOS transistor $TN_3$ of the second branch, as well as the second NMOS transistor $TN_2$ common to the first and to the second branch, then discharge the internal node $IN_3$ or $IN_4$ the potential of which is the lowest. The discharge current then flows through the diodes $Td_1$ and $Td_2$ in the opposite direction, which has the effect of limiting the low value of the voltage applied to $IN_1$ or $IN_2$ due to the discharge at the internal nodes to the lowest potential to the value |vtp+vbep|, a value in which Vtp represents the voltage threshold value of the P-channel-type MOS transistor for a zero source-substrate voltage, and in which Vbep represents the substrate-effect voltage associated with the same transistor.

More particularly, it is shown that each diode making it possible to limit the low value of the voltage applied to the gate electrode of the first $TP_1$ and of the second $TP_2$ PMOS transistor, and thus on the corresponding internal nodes $IN_1$ and $IN_2$, is advantageously formed by a PMOS transistor $Td_1$, $Td_2$ the gate electrode of which is connected to the reference voltage Vss.

This embodiment makes it possible, for the defined positive value, to obtain a voltage value close to three volts for the discharge time in question. The transistors $Td_1$ and $Td_2$ used to produce the abovementioned diodes may advantageously be dimensioned in such a way as to exhibit a relatively high resistance so as to avoid the propagation of a low voltage level on the bit lines, which, clearly, have been made to communicate with the corresponding internal node $IN_1$ and $IN_2$ respectively due to the switching and the linking of the abovementioned internal nodes to the corresponding global bit lines by the multiplexing transistors which have been selected. In the previously described example, it is thus understood that the voltage level held on the bit line corresponding to the low level is then equal to 3 volts.

A more detailed description of the profile of the noteworthy voltages at specific test point of the line amplifier, the subject of the present invention represented in FIG. 2a, will now be described in connection with FIGS. 3a and 3b.

In the abovementioned figures, the ordinate axis is graduated in voltage value in volts and the abscissa axis is graduated in tens of nanoseconds.

The abovementioned timing diagrams were obtained on the basis of an embodiment in which 512 memory cells were connected to the global bit lines delivering the bit signals $D_1$, $D_2$ and complemented bit signals $\overline{D_0}$, $\overline{D_1}$ respectively.

In FIG. 3a, signal timing diagrams have been represented relating to the multiplexing control signal $RS_0$, $RS_1$, to the read control signal CL, to the signal corresponding to the bit D and complemented bit $\overline{D}$ signal in the region of the internal nodes $IN_1$ and $IN_2$ respectively, to the complemented precharged [sic] control signal $\overline{CPrech}$, and, finally, to the read signal S delivered by the output stage 4.

In FIG. 3b have been represented the global bit signal $D_0$ and the complemented global bit signal $\overline{D_0}$, the signals corresponding to the first node and to the second internal node $IN_1$ and $IN_2$, the signals corresponding to the third and to the fourth internal node $IN_3$ and $IN_4$.

In FIG. 3b there may be noted the existence of a fall-off of the voltages at the third and fourth internal node $IN_3$, $IN_4$ during the evaluation phase, this fall-off being caused by the second NMOS transistor $TN_2$, which amplifies the preliminary difference between the voltage levels of the bit signal and of the complemented bit signal D, $\overline{D}$ at the first $IN_1$ and second $IN_2$ internal node respectively.

As has been represented moreover in FIG. 2a, it is shown that the line amplifier, the subject of the present invention, may further comprise, connected directly to the first and to the second direct link respectively, that is to say finally to the third and to the fourth internal node $IN_3$, $IN_4$ respectively, an intermediate output stage formed by a PMOS transistor and an NMOS transistor which are connected in series between the power supply voltage Vdd and the reference voltage Vss. The corresponding transistors bear the reference $TP_{63}$ and $TN_{63}$ as far as the intermediate output stage is concerned, connected to the internal node $IN_3$ and reference $TP_{64}$ and $TN_{64}$ respectively as far as the intermediate output stage connected to the fourth internal node $IN_4$ is concerned. The common gate electrode of the transistors $TP_{63}$, $TN_{63}$ and $TP_{64}$, $TN_{64}$ respectively is connected to the first and to the second direct link respectively, that is to say in fact to the third and fourth internal nodes $IN_3$ and $IN_4$ respectively. It is shown that the drain-source common point of the transistors $TP_{63}$ and $TN_{63}$ and $TP_{64}$ and $TN_{64}$ respectively delivers. the bit read signal and the complemented bit read signal respectively or, more specifically, the signal S as represented in FIG. 2a.

According to a more advantageous embodiment, it is shown that the intermediate output stages previously mentioned may further comprise, interposed between the PMOS transistor and the NMOS transistor $TP_{63}$, $TN_{63}$ or $TP_{64}$, $TN_{64}$ respectively, a PMOS transistor $TP_{73}$, $TP_{74}$ the gate electrode of which is driven by the precharge control signal CPrech delivered by the invertor 2. The PMOS transistors $TP_{73}$ and $TP_{74}$ make it possible to cancel the current in the output branches since the NMOS transistors $TN_{63}$ and $TN_{64}$ are conducting during the precharge phase.

Finally, the intermediate output stage such as the intermediate output stage relating to the fourth intermediate node $IN_4$ may advantageously be followed by a two-state latch, bearing the reference 3, to which can be connected the output stage proper, 4, which then plays the role of separator stage and of memory.

Conventionally, the two-state latch may comprise an NMOS-type switching transistor denoted $Tl_1$, connected between the output of the intermediate output stage formed by the transistors $TP_{64}$, $TN_{64}$ and $TP_{74}$ and a two-state latch proper formed in a conventional way by the transistors $Tl_2$, $Tl_3$, $Tl_4$, $Tl_5$, these transistors of PMOS and NMOS type respectively in fact constituting the two stages of a latch, the transistors $Tl_4$ and $Tl_5$ making it possible to maintain the stored level in the NMOS transistor $Tl_1$ is turned off during the precharge phase.

In the same way, the output stage forming a separator stage 4 can be formed by two PMOS and NMOS transistors $TS_1$ and $TS_2$ connected between the power supply voltage Vdd and the reference voltage Vss, this separator output stage receiving the signal delivered by the twostate latch 3 and delivering the read bit signal SL [sic].

A line amplifier for a static RAM memory has thus been described, which is of particularly high performance to the extent that all the technical characteristics previously mentioned in the description make it possible to achieve all the goals sought. Moreover, it is shown that, by reason of the global architecture adopted for the implementation of such a line amplifier, installation in the form an integrated circuit appears particularly simple, while the implementation of the control signals can easily be carried out.

Finally, it is shown that the line amplifier for static RAM memory, the subject of the present invention, appears particularly beneficial to the extent that it is equipped with multiplex inputs for the bit and complemented bit signals, this functionality appearing to be a major benefit by reason of the fact that it is not possible, in current memories, to increase the number of word lines to infinity, although these memories feature ever greater density, multiplexing thus making it possible to divide the number of word lines by a constant, most often a power of two, while the width of the word data field is multiplied by the same constant. Due to the fact that the number of external output ports of the memory cannot vary, the inputs are thus multiplexed. Moreover, it is shown that the multiplexing transistors do not play a part in the operation proper of the amplifier, the subject of the invention, in which, by virtue of the presence of the transistors $Td_1$ and $Td_2$, it is possible, during the discharge time, to maintain an appropriate value of voltage on the lines transporting the bit signal, and in that way to obtain a high switching speed.

I claim:

1. A line amplifier for a static RAM memory, comprising a differential stage with positive feedback between a first branch and a second branch which are connected between a power supply voltage (Vdd) and a reference voltage (Vss), each said branch receiving at least one bit signal (D) and the complemented bit signal ($\overline{D}$), respectively, and an output stage delivering a bit read signal, wherein said first branch includes:

a first PMOS transistor, a first NMOS transistor and a second NMOS transistor which are connected in series between said power supply voltage and said reference voltage, the gate electrode of said first PMOS transistor receiving the bit signal (D) being connected to the gate electrode of said first NMOS transistor through a diode, thereby enabling a low value of voltage applied to the gate electrode of said first PMOS transistor to be limited to a defined positive threshold value, the gate electrode of said second NMOS transistor receiving a read control signal (CL), said second branch including:

a second PMOS transistor and a third NMOS transistor which are connected in series between said power supply voltage (Vdd) and the drain-source common point of said first and second NMOS transistors of the first branch, the gate electrode of said second PMOS transistor receiving the complemented bit signal ($\overline{D}$) being connected to the gate electrode of said third NMOS transistor through a diode thereby enabling a low value of voltage applied to the gate electrode of said second PMOS transistor to be limited to said defined positive threshold value, said second NMOS transistor common to the first and second branches thus providing amplification of a preliminary difference between the voltage levels generated by a transition of the bit signal (D) and of the complemented bit signal ($\overline{D}$), said first and second branches each further including:

a precharged NMOS transistor connected between the power supply voltage and the drain-source common point of said first and second NMOS transistors of the first branch and said third NMOS transistor of said second branch, the gate electrode of said precharge NMOS transistor receiving a precharge control signal, and forming said positive feedback, a first direct connection between the drain-source common point of said first PMOS transistor and said first NMOS transistor of the first branch and the gate electrode of the third NMOS of the second branch, a second direct connection between the drain-source common point of said second PMOS transistor and said third NMOS transistor of the second branch and the gate electrode of said first NMOS transistor of the first branch, and a PMOS-type switching transistor connecting said first and second direct connections, and having a gate electrode driven by a complemented precharge control signal.

2. A line amplifier according to claim 1, wherein each of said diode enabling limiting of the low value of the voltage applied to the gate electrode of said first and second PMOS transistors, respectively, comprises a PMOS transistor having a gate electrode connected to said reference voltage (Vss), thereby permitting said defined threshold positive value to obtain a voltage value close to 3 volts.

3. A line amplifier according to claim 1 further comprising an inverter formed by a further PMOS transistor and a further NMOS transistor connected in series between said power supply voltage (Vdd) and said reference voltage (Vss), a common gate electrode of said further transistors receiving said complemented precharge control signal and a drain-source common point of said further transistors delivering said precharge control signal.

4. A line amplifier according to claim 1 further comprising, connected directly to said first and second direct connections, respectively, an intermediate output stage formed by a further PMOS transistor and a further NMOS transistor connected in series between said power supply voltage (Vdd) and said reference voltage (Vss), a common gate electrode of said further transistors being connected to said first and second direct connections, respectively, and a drain-source common point of said further transistors delivering said bit read signal.

5. A line amplifier according to claim 4, wherein at least one of the output stages further comprises, interposed between said further PMOS transistor and said further NMOS transistor, a PMOS transistor having a gate electrode driven by said precharge control signal.

6. A line amplifier according to claim 4, wherein said intermediate output stage is followed by a two-state latch and by a separator stage.

* * * * *